United States Patent [19]

Fichot et al.

[11] 4,427,993

[45] Jan. 24, 1984

[54] THERMAL STRESS RELIEVING BIMETALLIC PLATE

[75] Inventors: Julie Y. Fichot, Skaneateles; Alfred Roesch, Auburn, both of N.Y.

[73] Assignee: General Electric Company, Syracuse, N.Y.

[21] Appl. No.: 209,001

[22] Filed: Nov. 21, 1980

[51] Int. Cl.³ .............................................. H01L 23/02
[52] U.S. Cl. ........................................ 357/81; 357/67
[58] Field of Search ................................... 357/81, 67

[56] References Cited

U.S. PATENT DOCUMENTS

| | | | |
|---|---|---|---|
| 3,296,501 | 1/1967 | Moore | 357/81 X |
| 3,399,332 | 8/1968 | Savolainen | 357/81 |
| 4,320,412 | 3/1982 | Hynes et al. | 357/67 X |

Primary Examiner—Martin H. Edlow
Attorney, Agent, or Firm—Robert J. Mooney

[57] ABSTRACT

A thermal matching element which exhibits high electrical conductivity and high thermal conductivity is used to join a heat generating semiconductor device with a heat transmissive electrically conductive members. The thermal matching element is independently selected for different directions in the plane of the matching surface.

12 Claims, 5 Drawing Figures

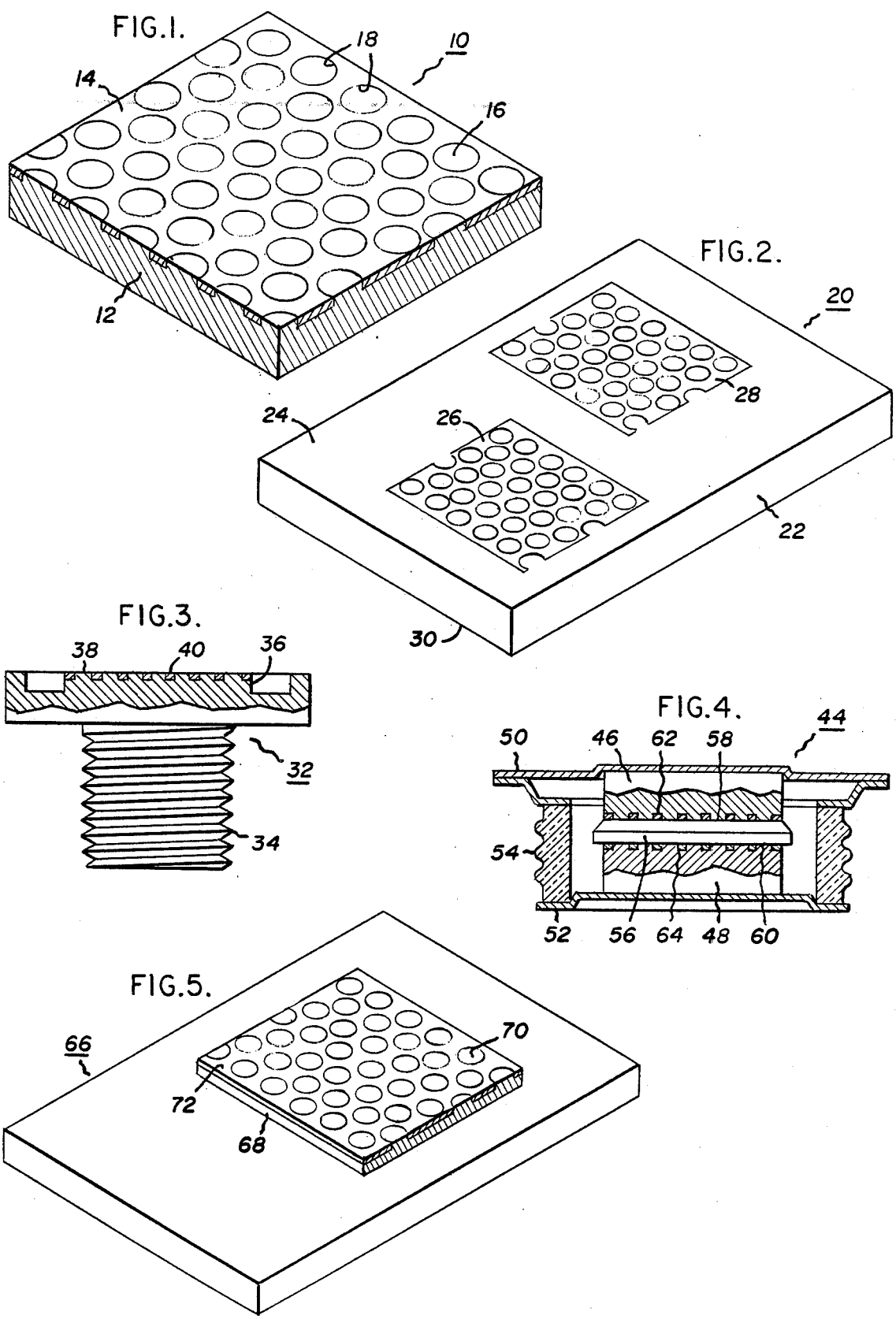

THERMAL STRESS RELIEVING BIMETALLIC PLATE

This invention relates in general to stress relieving elements and more particularly to a thermal stress relief plate adapted to join a heat generating element, such as a semiconductor device, and a heat transmissive element in low thermal and electrical impedance and low stress relationship.

It is a continuing need in a number of fields such as semiconductor device manufacture to provide low thermal impedance stress relief elements for electrically and thermally coupling heat generating devices with heat conductive elements for efficient cooling. In the past, stress relief plates having thermal coefficients of expansion between those of the heat generating element and the thermally transmissive element have been disposed therebetween for minimizing stress during temperature cycling while allowing efficient heat removal and low resistance electrical connection to be made to the semiconductor device. Where semiconductor devices and heat conducting elements such as copper elements have been joined, intermediate layers of materials such as tungsten and molybdenum have been employed which although relatively effective, have nevertheless provided less than optimum thermal matching and, in addition, are of relatively high cost, have been employed.

In joining semiconductors with heat transmissive elements in a semiconductor package it is desirable to employ reliable, hard-solder interfaces between the several elements. This reduces the tendency of such structures to exhibit fatigue at the interfaces therein after repetitive expansion and contraction during thermal cycling. However, where two elements are joined having sufficiently different coefficients of thermal expansion it is impractical to employ such hard solder interface layers inasmuch as fracture during thermal cycling is likely to occur at an early time. Substantial effect has therefore been directed towards providing thermal matching structures which effectively relieve the stresses put upon them by the two elements which they join. For example, U.S. Pat. No. 3,097,329 to Siemens describes a thermal matching plate which comprises a sintered combination of powders to produce a matching element which has a first surface primarily comprised of tungsten, a second surface primarily comprised of copper and a graded composition therebetween. The element as described appears to have the coefficient of expansion of copper on the other so that a semiconductor element and a copper heat transmissive housing can be joined without undue thermal stress on the semiconductor device. The element requires a pressing and a sintering operation for fabrication, the sintering operation being carried out in a hydrogen atmosphere at a temperature in excess of 1000° centigrade.

A slightly different structure for providing the function of a stress relief plate is described in U.S. Pat. No. 3,368,122 to Fishman, et al. The matching plate is comprised in one embodiment of a disc of copper surrounded by an annular ring or band of a material having a substantially lower coefficient of expansion such as Kovar, a nickel-iron-cobalt composition. In another embodiment a number of copper discs are inset in apertures in a larger disc shaped plate of a low thermal coefficient of expansion material such as Kovar. The plate of Fishman provides a relatively better match to a semiconductor element than a plate of pure copper but it does not provide any substantial stress relief at its interface with heat transmissive copper stud 13 of Fishman's FIG. 1. Consequently, an otherwise undesirable soft solder interface layer must be used between the expansion plate and the copper stud.

It is the object of this invention to provide a thermal coefficient of expansion matching element for joining two members having different coefficients of thermal expansion in low stress relationship. It is another object of this invention to provide such a thermal coefficient of expansion matching element which can be fabricated without the need for expensive and complex manufacturing operations.

It is yet another object of this invention to provide a thermal coefficient of expansion matching element which exhibits a first coefficient of thermal expansion on a first surface and a second coefficient of thermal expansion on a second major surface wherein the first and second coefficient of thermal expansion may be independently selected so as to provide the most advantageous match to the elements joined to the first and second surfaces respectively.

It is a further object of this invention to provide a thermal matching element which exhibits high electrical conductivity and high thermal conductivity so as to be especially effective in joining a heat generating semiconductor device with a heat transmissive electrically conducting member.

It is a still further object of this invention to provide a thermal coefficient of expansion matching element which exhibits a thermal coefficient of expansion which may be independently selected for different directions in the plane of the matching surface. It is yet another object of this invention to provide a method for locally modifying the thermal coefficient of expansion of an element for advantageous attachment of a second element thereto where the first and second elements have different coefficients of thermal expansion and could not otherwise be directly joined together.

Briefly stated and in accordance with a presently preferred embodiment of this invention a thermal coefficient of expansion matching element having a first coefficient of expansion at a first major joining surface and a second coefficient of expansion at a second major joining surface includes a body of a first material characterized by a first coefficient of thermal expansion said body having a first and second major joining surfaces and a lattice of thermal coefficient of expansion modifying material embedded into a first surface of said body for establishing an intermediate thermal coefficient of expansion between that of said body alone and said lattice material alone.

In accordance with an aspect of this invention particularly suited to joining a heat producing semiconductor device with a copper or other heat transmissive housing element, a thermal expansion matching element comprises a body of a first material such as copper having low thermal and electrical impedance and being generally of plate-like configuration having first and second major surfaces, the first surface particularly adapted for joining with said thermally and electrically transmissive housing element and the second major surface, having a lattice of thermal coefficient of expansion modifying material such as Invar embedded therein to present a joining surface having a thermal coefficient of expansion intermediate that of copper alone and Invar alone.

In accordance with still another aspect of this invention, a thermal coefficient of expansion matching element is provided having a plurality of matching surfaces each having an independently selectible thermal coefficient of expansion for joining a like plurality of dissimilar members.

The features of the invention which are believed to be novel are pointed out with particularity in the appended claims. The invention itself, however, both as to its organization and method of operation together with further objects and advantages thereof may best be understood by reference to the following description taken in connection with the accompanying drawing in which:

FIG. 1 is a view of a thermal coefficient of expansion matching plate for joining two dissimilar elements, in accordance with a first aspect of this invention.

FIG. 2 is a view of a thermal coefficient of expansion matching element for joining a plurality of such dissimilar elements.

FIG. 3 is a section view of a stud type semiconductor receiving element modified in accordance with this invention.

FIG. 4 is a view of a press pack semiconductor device in accordance with this invention.

FIG. 5 is a view of an isolated substrate for receiving a semiconductor element in accordance with this invention.

Referring now to FIG. 1 an expansion matching element 10 includes a main body portion 12 of a first yieldable material such as copper having a first thermal coefficient of expansion. A lattice 14 of a coefficient of expansion modifying material such as Invar or other suitable material is embedded into a first surface 16 of body 12. Preferably, lattice 14 is embedded into surface 16 by pressing the lattice into the body so as to cause the material of the body to cold flow into apertures 18 of the lattice.

The overall thermal coefficient of expansion of stress relieving element 10 is determined by the selection of material for body 12 and lattice 14 and by the ratio of surface areas of the apertures and the total area of the device. The overall coefficient of thermal expansion $\alpha_T$ may be expressed as:

$$\alpha_T = \frac{A_1}{A_1 + A_2} \alpha_1 + \frac{A_2}{A_1 + A_2} \alpha_2 \qquad \text{Eq. 1}$$

where $\alpha_1$=coefficient of linear expansion of lattice material, and $\alpha_2$=coefficient of thermal expansion of body material, and $A_1$ and $A_2$=surface areas of the lattice and body materials respectively.

The conductivity $K_T$, the thermal conductivity as well as the electrical conductivity of the element of this invention in a direction perpendicular to the surface thereof into which the lattice material is embedded may be expressed as:

$$K_T = \frac{A_1}{A_1 + A_2} K_1 + \frac{A_2}{A_1 + A_2} K_2$$

where $A_1$ and $A_2$ are as in equation number 1 and $K_1$ and $K_2$ are the conductivities, either thermal or electrical, of the lattice material and body material respectively. The conductivity of the matching element through the remainder of the body is, of course, equal to the conductivity of the body material.

The joining element of this invention may be even more readily understood by reference to the following example of an embodiment thereof particularly suited for use in joining a heat generating semiconductor element with a heat transmissive portion of a package thereof. Conventionally, semiconductor devices are packaged in housings which include as a portion thereof a heat transmissive element which may also be of low electrical resistance for mating with a heat sink to which the package is attached for conducting heat away from the semiconductor device itself. Such a heat transmissive element may, for example, be a copper plate adapted for mounting to a heat sink by mechanical means. It is in the attachment of the heat generating semiconductor device to such a copper plate that this invention will be illustrated. The thermal coefficient of expansion of copper is about $17 \times 10^{-6}$ inches per inch per degree centigrade. The thermal coefficient of expansion of silicon is about $3 \times 10^{-6}$ inches per inch per degree centigrade. The stresses which would be generated by directly attaching a silicon semiconductor device and a copper heat transmissive element would be sufficient to fracture the silicon element during normal operation. Consequently, an intermediate thermal matching element must be provided between the semiconductor device and the copper element. In accordance with this invention such an element, in accordance with FIG. 1, includes a body portion manufactured of copper which may, for example, be OHFC copper and which is preferably not highly annealed. A lattice which is preferably characterized by a low coefficient of thermal expansion such as a 36% nickel, 64% iron alloy is embedded into a surface of the copper body also as shown in FIG. 1. The thermal coefficient of expansion of such an alloy which is available under the trade name Invar manufactured by Amex Corp. is less than about $2 \times 10^{-6}$ inches per inch per degree centigrade. The thermal coefficient of expansion of the completed thermal expansion matching element in accordance with this invention depends upon the ratio of surface areas of the lattice and the body at the joining surface. For example, where an equal area of body material and lattice material is presented at the joining surface a coefficient of thermal expansion of $9.5 \times 10^{-6}$ inches per inch per degree centrigrade may be calculated according to equation 1 supra. Where an even lower coefficient of thermal expansion is desired the ratio of lattice surface area to copper surface area may be increased and, for example, where 33% copper, 67% Invar is presented at the joining surface a thermal coefficient of expansion of $7 \times 10^{-6}$ inches per inch per degree centigrade may be obtained. Such a low coefficient of thermal expansion will permit the direct mounting of a heat generating silicon device to the stress relief element of this invention without generating the high stresses hereinabove identified which would tend to fracture the silicon element. Further, desirable hard solder interface layers may be utilized in joining a silicon semiconductor device to the thermal expansion element in this invention in order to obtain long life without thermal fatigue.

In addition to copper and Invar as described in the foregoing exemplary embodiment of the invention, other materials may be employed both for the body portion and for the lattice portion of the stress relief element in accordance herewith. For example, in addition to copper; silver, aluminum, and magnesium may also be employed for the body portion with magnesium especially desirable where weight is particularly important; and molybdenum, tungsten, carbon, glass, and ceramic as well as iron-nickel alloy for the lattice portion. The body material is preferably selected in order to have a low yield strength so that the lattice material may be easily embedded therein.

It has been discovered that a further reduction in thermal coefficient of expansion below that predicted by the foregoing formulas may be obtained by heat treating the expansion matching element after fabrication thereof. In accordance with an exemplary embodiment of this invention wherein copper was used for the body portion and Invar was used for the lattice portion, a coefficient of thermal expansion of $9.5 \times 10^{-6}$ inches per inch per degree centigrade is predicted by equation 1 where a 50% surface area ratio is provided. After sintering at a temperature of 750° centigrade for 1-2 hours and a measured coefficient of thermal expansion of $8.5 \times 10^{-6}$ was obtained. This represents somewhat more than a 10% additional reduction in coefficient of thermal expansion and is desirable where a low total coefficient of thermal expansion is required. It is believed that the reduction in coefficient of thermal expansion beyond that predicted by equation 1 which occurs upon heat treating is due to interdiffusion of the body and lattice materials. For example, at a temperature as low as 700° centigrade the solubility of copper and $\alpha$-Fe is about 1.25%.

The fabrication of a thermal matching element in accordance with this invention is both flexible and economical. Preferably a lattice of selected material is provided having an array of apertures therein which have a total area as a percentage of the surface area of the lattice material which is selected in accordance with equation 1. Such a lattice may be readily manufactured in accordance with well known methods such as providing a sheet of material and punching or cutting or otherwise suitably removing portions thereof to provide the desired lattice element.

The shape of the apertures in the lattice material may be varied in accordance with this invention to provide a coefficient of thermal expansion in the matching element which is either uniform for all directions or which is independently selected for different directions parallel to the joining surface. For example, uniform expansion is provided by a pattern of circular apertures as illustrated in FIG. 1. Where a coefficient of expansion which varies with direction is required an array of stripes, rectangles, squares, triangles and the like may be utilized. The surface of the body portion is prepared for joining with the lattice by cleaning. For example, where copper is used as a body material it is preferred to degrease, for example, in methanol chloride or the like and to anneal, for example, at greater than 475° centigrade for OHFC copper and preferably between 500° and 700° centigrade for at least about one hour. The Invar lattice may be advantageously cleaned in a 10% solution of hydrochloric acid and water. The lattice and body elements are joined by pressing at a sufficient pressure to cold flow the copper into the apertures in the lattice material. It has been found that a pressure of at least 140 KPSI is advantageously employed. After pressing, the heat treatment process hereinabove described may be employed if desired.

It is anticipated that where large quantities of material in accordance with this invention are to be manufactured, that passing the two elements between rollers at high pressure to embed the lattice in the body material may be desirable. It should be recognized that suitable care must be taken during such rolling operations to prevent distortion of the finished thermal matching element and where such distortion occurs a suitable flattening operation should be employed. Following the optional heat treatment step it is preferred to plate the resulting heat transfer element, with solderable coating, for example, nickel which may conveniently be applied by electroless nickel plating. Such plating is especially preferred where a silicon device is to be joined with the thermal matching element in order to prevent copper from forming copper silicide at the interface of the semiconductor device and the thermal matching element which would be detrimental to device performance. In accordance with an exemplary embodiment of this invention where operation in connection with a silicon semiconductor device is desired, the surface of the completed but unplated thermal matching element is cleaned, for example, in hydrochloric acid and nickel is applied by the electroless nickel plating method. The nickel plated element is rinsed in methanol and silver is preferably applied for increasing the surge current characteristics of the assembly. Where especially high power applications are anticipated, it is preferred in accordance with this invention to apply a few mils of copper to the surface of the thermal matching element which will interface with the semiconductor element and to nickel plate the copper surface to a thickness of about 50 to 200 microinches.

It is a feature of this invention that a plurality of elements may be joined together by a single thermal coefficient of expansion matching element in accordance herewith. Such an element is illustrated at FIG. 2 and includes a body portion 22 which is preferably selected in accordance with the same considerations hereinabove discussed in connection with matching element 10. First surface 24 of body 22 includes first and second lattice portions 26 and 26 embedded therein. Lattice protions 26 and 28 are spaced apart on surface 24 and are independently selected to provide matching surfaces for receiving elements thereon having different coefficients of thermal expansion. For example, semiconductor devices are currently manufactured having substrates of silicon, gallium arsenide, germanium and the like. The coefficients of thermal expansion of these materials are not idnetical and it is often times desirable to include more than one such semiconductor device in a single device package. A homogeneous stress relief element in accordance with the prior art cannot accommodate such multi-device configurations without compromising the matching characteristics. Stress relief element of FIG. 2 may accommodate such disparate coefficients of expansion of either by selecting different materials for lattices 26 and 28 or by varying the area ratio of lattices of the same material in order to provide different overall coefficients of thermal expansion.

While device 20 of FIG. 2 illustrates thermal coefficient of expansion matching element having two device receiving portions on a single surface, the local coefficient of thermal expansion of each portion being independently determined, it will be appreciated that other surfaces of device 20 may similarly have lattice members embedded therein for modifying the thermal coefficent of expansion thereof. For example, lower surface 30 may be adapted for connection to a material having a thermal coefficient of expansion significantly different from that of body 22 by embedding a selected lattice element therein.

While the invention has been thus far described in accordance with an embodiment thereof especially suited for providing a matching element for disposition between two joined elements, it is also within the scope hereof to provide an element for receiving a heat generating device such as a semiconductor device which element comprises a major structural package component. FIG. 3 illustrates such a device in accordance with this invention wherein a semiconductor receiving element 32 having a threaded portion 34 and a pedestal portion 36 is illustrated. Such an element is commonly employed for receiving medium power semiconductor devices and is particularly adapted for connection to a heat sink through the use of threaded portion 34. Conventionally, a matching plate such as a tungsten or molybdenum plate is disposed on surface 38 of pedestal portion 36 and a semiconductor element is attached thereto. While a thermal coefficient of expansion of matching element such as the one illustrated in FIG. 1 hereof could be directly substituted for a similar element in accordance to the prior art, it is an additional advantage of the invention that the necessity for such an element can be completely overcome by embedding a lattice 40 of thermal coefficient of expansion of modifying material directly into surface 38 of stud 32. Lattice 40 is selected in accordance with the same considerations hereinabove set forth in connection with the device of FIG. 1 and the overall coefficient of thermal expansion of surface 38 of study 32 may be calculated using equation 1.

Still another embodiment of this invention especially suited for high power semiconductor devices is illustrated at FIG. 4. A complete semiconductor device 44 includes first and second massive pole piece portions 46 and 48 having peripheral flanges 50 and 52 respectively extending therefrom. Flanges 50 and 52 are preferably hermetically joined to an annular insulator 54. Conventionally such a package has employed one or more stress relieving matching elements disposed between pole piece portions 46 and 48 and semiconductor device 56. In accordance with this invention, device receiving surface 58 and 60 of pole piece portions 46 and 48 are adapted to directly receive semiconductor element 56 by embedding thermal coefficient of expansion modifying lattice members 62 and 64 therein in the same manner as heretofore set forth. The same considerations for selecting the lattice material and the area ratio thereof as hereinabove described apply to device 44. It is an additional advantage of a package such as package 44 that hard solder interfaces between device 56 and pole pieces 46 and 48 may be employed as opposed to dry sliding interfaces as have hereinbefore been required to provide adequate stress relief.

This invention is also useful for providing stress relief in devices which require electrically isolated construction. As shown in FIG. 5, isolated substrate 66 which is preferably selected for high conductivity and high electrical resistance, for example alumina or berylia, has a conductive device receiving layer 68, for example copper, bonded thereto by any conventional means but preferably in accordance with the process described in U.S. Pat. No. 3,994,430. Upper surface 70 of layer 68 is adapted to directly receive a semiconductor element by embedding a thermal coefficient of expansion modifying lattice 72 therein in the same manner as has been described. A semiconductor device may then be directly connected to surface 70 without the need for an intermediate stress relieving element.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. In combination with a semiconductor element having a predetermined thermal coefficient of expansion, a thermally and electrically conductive plate for receiving in direct contact therewith said semiconductor element, said plate comprising:
   a body of a first material characterized by a first thermal coefficient of expansion;
   a semiconductor element receiving surface on said body; and a lattice of thermal coefficient of expansion modifying material embedded in and flush with said body at said semiconductor element receiving surface which changes the thermal coefficient of expansion of said body at said surface to an intermediate value between said predetermined thermal coefficient of expansion and said first thermal coefficient of expansion.

2. The combination of claim 1 wherein said first material is selected from the group consisting of copper, silver, aluminum and magnesium.

3. The combination of claim 1 wherein said thermal coefficient of expansion modifying material is selected from the group consisting of molybdenum, tungsten and and iron-nickel alloy containing 40–50% nickel.

4. The combination of claim 1 wherein said lattice comprises a sheet of said thermal coefficient of expansion modifying material having an array of circular apertures therein, said sheet being effective to reduce the proportion, at said surface, of material having said first thermal coefficient of expansion by between 10 and 90 percent.

5. The combination of claim 1 and further comprising a thin layer of said first material overlying said surface and said lattice.

6. The combination of claim 1 and further comprising a second lattice of thermal coefficient of expansion modifying material embedded in and flush with said surface for locally modifying the thermal coefficient of expansion of said body to more closely match the coefficient of thermal expansion of a second semiconductor element.

7. The combination of claim 1, and further comprising a layer of solderable material covering said semiconductor element receiving surface.

8. The combination of claim 7 wherein said layer of solderable material comprises a layer of nickel.

9. The combination of claim 1, wherein said body includes a second surface opposite said semiconductor element receiving surface and parallel thereto, and further comprising a threaded stud portion extending from said second surface adapted for connection to a heat sink.

10. In combination with a heat generating semiconductor device, a thermally and electrically conductive plate for receiving in direct contact therewith said heat generating semiconductor device so as to provide thermal and electrical contact thereto, comprising:
   a body of a first yieldable material characterized by low thermal and electrical impedance and having a first surface characterized by a first thermal coefficient of expansion $\alpha_1$;
   a lattice of thermal coefficient of expansion modifying material having a second coefficient of thermal expansion $\alpha_2$ embedded in said body flush with said surface to form a device receiving surface having a first areal percentage $A_1$ of said first material and a second areal percentage $A_2$ of said coefficient of expansion modifying material, said modified surface having an overall coefficient of thermal expansion $\alpha_T$ equal to $$\frac{A_1}{A_1 + A_2} \alpha_1 + \frac{A_2}{A_1 + A_2} \alpha_2$$

11. The combination of claim 10 wherein said first material is selected from the group consisting of copper, silver, aluminum and said thermal coefficient of expansion modifying material is selected from the group consisting of molybdenum, tungsten and an iron-nickel alloy containing 40–50% nickel.

12. A thermally and electrically conductive plate for receiving in direct contact therewith a semiconductor element having a predetermined thermal coefficient of expansion, said plate comprising:

- a body of a first material characterized by a first thermal coefficient of expansion;
- a semiconductor element receiving surface on said body; and a lattice of thermal coefficient of expansion modifying material embedded in and flush with said body at said semiconductor element receiving surface which changes the thermal coefficient of expansion of said body at said surface to an intermediate value between said predetermined thermal coefficient of expansion and said first thermal coefficient of expansion;
- and wherein said lattice comprises a sheet of said thermal coefficient of expansion modifying material having an array of non-symmetrical apertures therein, whereby the resulting thermal coefficient of expansion of said plate differs in different directions in the plane of said semiconductor element receiving surface.

* * * * *